(12) United States Patent  (10) Patent No.: US 9,595,992 B2
Arao et al.  (45) Date of Patent: *Mar. 14, 2017

(54) ELECTRONIC APPARATUS

(71) Applicant: KYOCERA Corporation, Kyoto-shi, Kyoto (JP)

(72) Inventors: Katsumi Arao, Higashiosaka (JP); Ryosuke Iwaya, Osaka (JP)

(73) Assignee: KYOCERA Corporation, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/094,931

(22) Filed: Apr. 8, 2016

(65) Prior Publication Data

US 2016/0226549 A1 Aug. 4, 2016

Related U.S. Application Data

(63) Continuation of application No. 14/615,181, filed on Feb. 5, 2015, now Pat. No. 9,354,665, which is a (Continued)

(30) Foreign Application Priority Data

Feb. 26, 2014 (JP) ................. 2014-034954

(51) Int. Cl.
*H05K 5/00* (2006.01)
*H04B 1/3888* (2015.01)
(Continued)

(52) U.S. Cl.
CPC ......... *H04B 1/3888* (2013.01); *G06F 1/1605* (2013.01); *G06F 1/1635* (2013.01);
(Continued)

(58) Field of Classification Search
USPC ..................... 361/753, 752, 754
See application file for complete search history.

(56) References Cited

U.S. PATENT DOCUMENTS

2006/0012034 A1* 1/2006 Kadoya ............... H05K 1/0203
257/712
2013/0236699 A1 9/2013 Prest et al.
(Continued)

FOREIGN PATENT DOCUMENTS

JP 1993333164 A 12/1993
JP 1993335435 A 12/1993
(Continued)

OTHER PUBLICATIONS

International Search Report dated Mar. 31, 2015 issued in counterpart International application No. PCT/JP2015/001006.
(Continued)

*Primary Examiner* — Andargie M Aychillhum
(74) *Attorney, Agent, or Firm* — Procopio Cory Hargreaves and Savitch LLP

(57) ABSTRACT

An electronic apparatus includes a cover panel and a case, and at least a board disposed therebetween. A plurality of components are disposed on a board and have heights different from one another. A gap reduction member is disposed so as to face the plurality of components. Steps are formed on the gap reduction member in accordance with the heights of the plurality of components which faces the plurality of components to reduce breakage of a cover panel of the electronic apparatus.

16 Claims, 11 Drawing Sheets

Related U.S. Application Data continuation of application No. 14/459,067, filed on Aug. 13, 2014, now Pat. No. 8,988,886.

(51) Int. Cl.
| | | |
|---|---|---|
| *G06F 1/16* | (2006.01) | |
| *G06F 1/20* | (2006.01) | |
| *H04R 7/04* | (2006.01) | |
| *H04M 1/02* | (2006.01) | |
| *H04M 1/03* | (2006.01) | |
| *H05K 1/18* | (2006.01) | |
| *H04R 17/00* | (2006.01) | |

(52) U.S. Cl.
CPC .......... *G06F 1/1656* (2013.01); *G06F 1/203* (2013.01); *H04M 1/0202* (2013.01); *H04M 1/0266* (2013.01); *H04M 1/03* (2013.01); *H04R 7/045* (2013.01); *H05K 1/181* (2013.01); *H05K 5/0017* (2013.01); *H04R 17/00* (2013.01); *H04R 2460/13* (2013.01); *H04R 2499/11* (2013.01)

(56) References Cited

U.S. PATENT DOCUMENTS

| | | | |
|---|---|---|---|
| 2013/0271394 A1* | 10/2013 | Chung | ................ G06F 3/01 345/173 |
| 2013/0328792 A1 | 12/2013 | Myers et al. | |
| 2014/0023430 A1 | 1/2014 | Prest et al. | |
| 2014/0030443 A1 | 1/2014 | Prest et al. | |

FOREIGN PATENT DOCUMENTS

| | | | |
|---|---|---|---|
| JP | 07-107087 | A | 4/1995 |
| JP | 1997008690 | A | 1/1997 |
| JP | H09-008690 | A | 1/1997 |
| JP | 2005173393 | A | 6/2005 |
| JP | 2009-159419 | A | 12/2007 |
| JP | 2008111984 | A | 5/2008 |
| JP | 2009-130121 | A | 6/2009 |
| JP | 2011-071567 | A | 4/2011 |
| JP | 2013-115615 | A | 6/2013 |
| JP | 2013131987 | A | 7/2013 |
| WO | 02054426 | A1 | 7/2002 |
| WO | 02054427 | A1 | 7/2002 |
| WO | 02054716 | A1 | 7/2002 |
| WO | 02054718 | A1 | 7/2002 |
| WO | 02054721 | A1 | 7/2002 |
| WO | 02054723 | A1 | 7/2002 |
| WO | 02054724 | A1 | 7/2002 |
| WO | 02054846 | A1 | 7/2002 |

OTHER PUBLICATIONS

Office Action dated Jul. 14, 2015 issued by Japanese Patent Office in counterpart Japanese application No. 2014-034954.

* cited by examiner

ELECTRONIC APPARATUS

CROSS-REFERENCE TO RELATED APPLICATIONS

This application is a continuation of U.S. application Ser. No. 14/615,181, filed on Feb. 5, 2015, which is a continuation of U.S. application Ser. No. 14/459,067, filed on Aug. 13, 2014, now U.S. Pat. No. 8,988,886, and claims the benefit of Japanese Application No. 2014-034954, filed on Feb. 26, 2014. The contents of the above applications are incorporated by reference herein in their entirety.

FIELD

The present invention relates to an electronic apparatus, and more particularly to a cover panel of an electronic apparatus.

BACKGROUND

In the related art various techniques are proposed for providing cover panels for displays of an electronic devices. These cover panels are subject to breakage and other damage such as cracking and chipping.

SUMMARY

A panel provided on the surface of an electronic apparatus has resistance to breakage.

For example, a sapphire panel is provided on an electronic apparatus. An outer surface of the sapphire panel facing outwards from a case, and an inner surface faces inwards into the case, such that the case and the sapphire panel form a housing. A board, for example, a circuit board, is disposed in the case. The board has a plurality of components that have varying heights. A gap reduction member faces the plurality of components on the board, and has a plurality of steps of varying heights that correspond to the heights of the plurality of components on the board. The gap reduction member is provided to reduce the number of gaps within the housing. A reduced number of gaps within the housing reduces a possibility of breakage or chipping of the sapphire panel when a force is applied to the outer surface of the sapphire panel.

DETAILED DESCRIPTION

<External Appearance of Electronic Apparatus>

Figure 1:
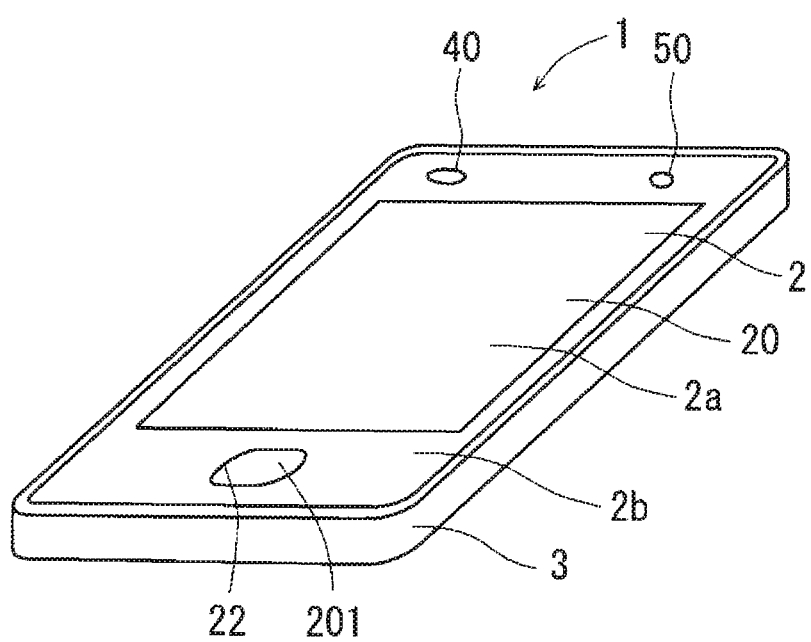
FIG. 1 is a perspective view illustrating an example of an external appearance of an electronic apparatus.
Figure 2:
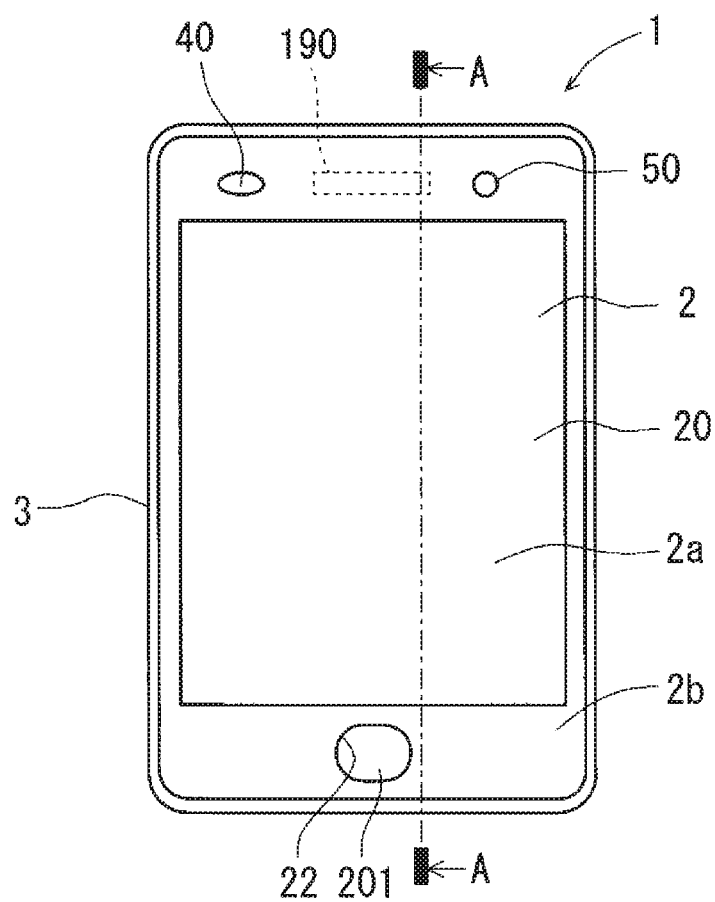
FIG. 2 is a front surface view illustrating an example of an external appearance of an electronic apparatus.
Figure 3:
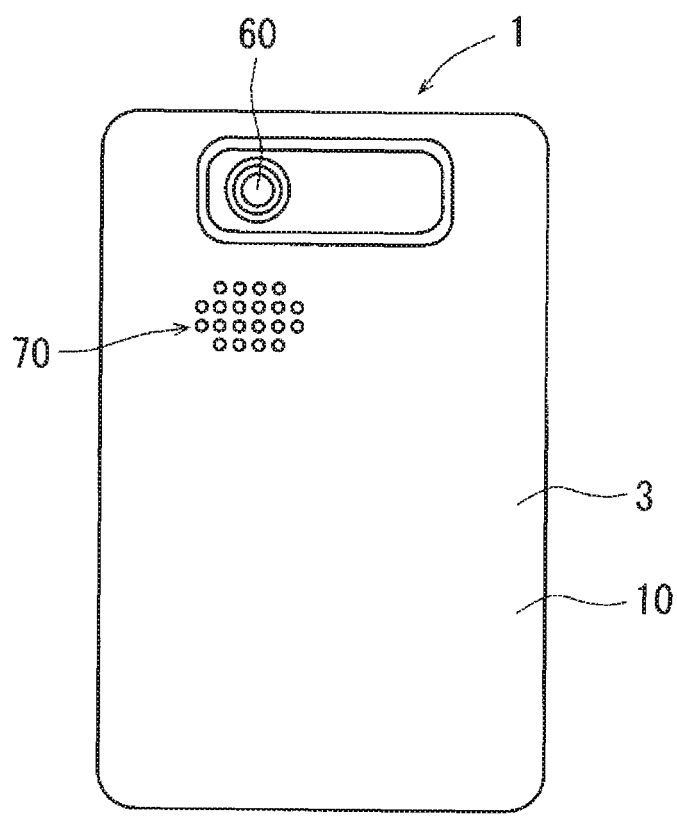
FIG. 3 is a rear surface view illustrating an example of an external appearance of an electronic apparatus.
Figure 4:
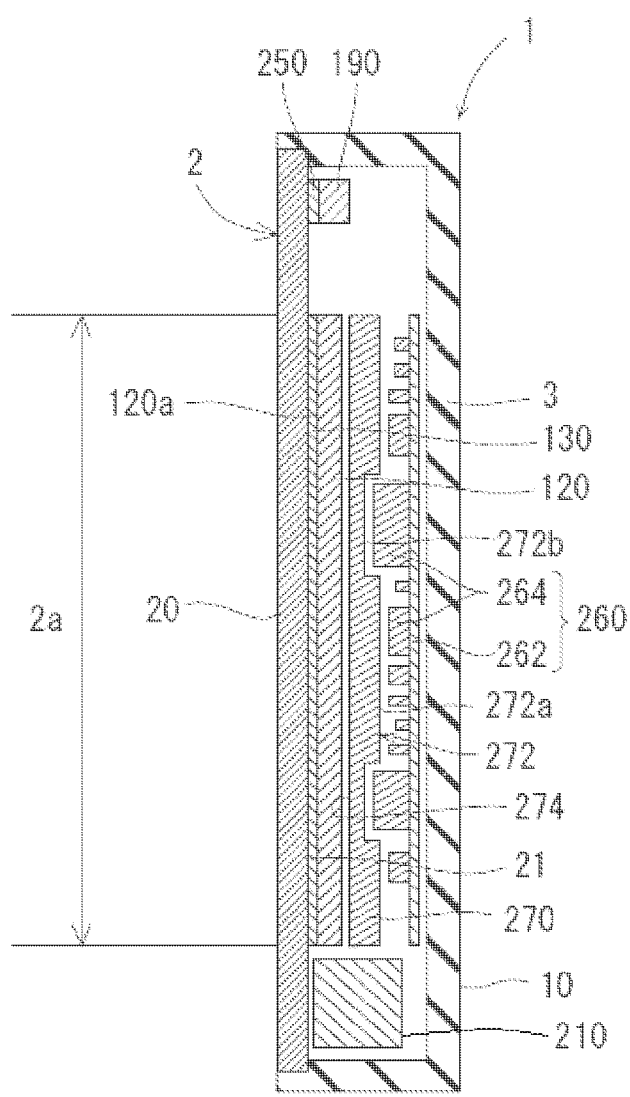
FIG. 4 is a view illustrating an example cross-sectional structure of an electronic apparatus.
Figure 5:
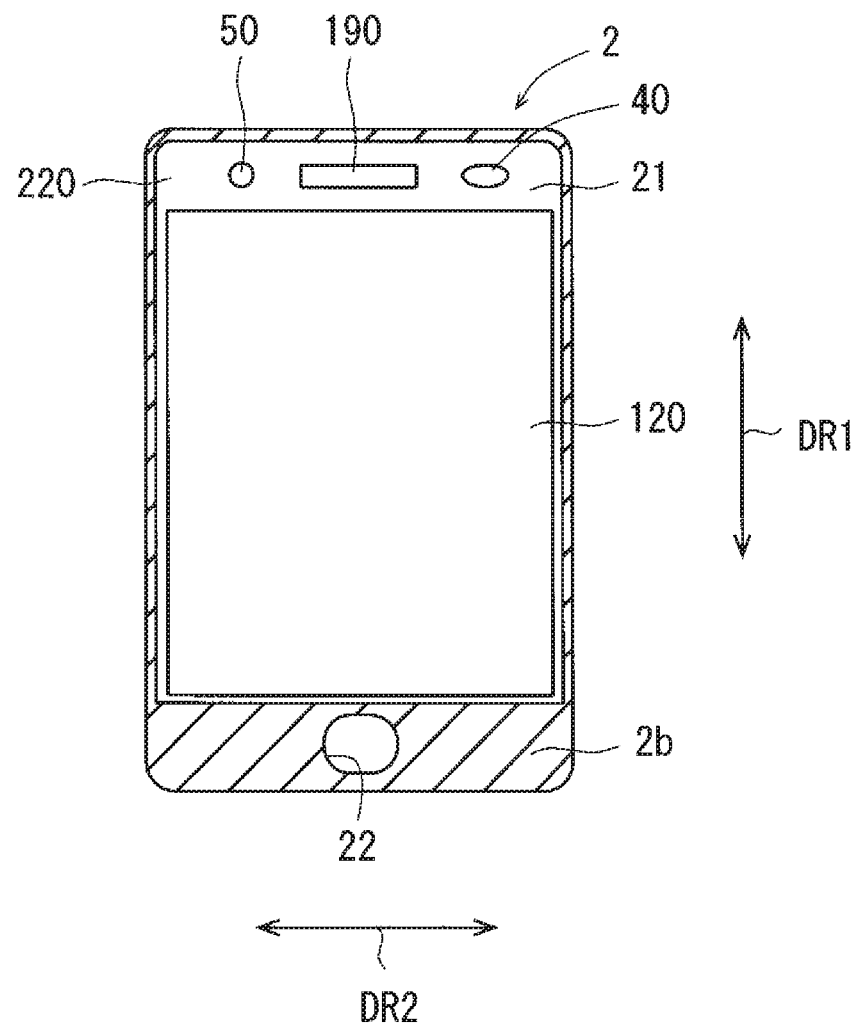
FIG. 5 is an example of a plan view of a cover panel when seen from an inner surface side.

FIGS. 1, 2 and 3 are examples of a perspective view, a front surface view, and a rear surface view, respectively, illustrating an external appearance of an electronic apparatus 1. FIG. 4 is a view schematically illustrating a cross-sectional structure along line A-A of the electronic apparatus 1 illustrated in FIG. 2. FIG. 5 is a rear surface view of a cover panel 2 included in the electronic apparatus 1. A piezoelectric vibrating element 190 and a display panel 120 included in the electronic apparatus 1 are installed on the cover panel 2 illustrated in FIG. 5. The electronic apparatus 1 is, for example, a mobile phone such as a smart phone.

As illustrated in FIGS. 1 to 4, the shape of the electronic apparatus 1 is approximately a rectangular plate shape in a plan view. The electronic apparatus 1 includes a transparent, and or light transmissive, cover panel 2 which covers a display surface 120a (see FIG. 4) of the display panel 120 and a case 3 which supports the cover panel 2.

The cover panel 2 is disposed on the surface of the electronic apparatus 1, specifically, on the front surface of the electronic apparatus 1. The cover panel 2 is arranged on a portion other than an edge area, for example a peripheral edge, of the front surface of the electronic apparatus 1.

The cover panel 2 has, for example, a plate shape, and an approximately rectangular shape in a plan view. The cover panel 2 includes a first surface 20 constituting a portion of the front surface of the electronic apparatus 1 and a second surface 21 that is positioned on the opposite side to the first surface 20 and faces the display surface 120a of the display panel 120. Hereinafter, the first surface 20 is also referred to as an "outer surface 20" and the second surface 21 is also referred to as an "inner surface 21." In addition, the cover panel 2 may be a plane panel having a planar shape or a curved panel having a curved shape.

The cover panel 2 is made of, for example, sapphire. That is, the cover panel 2 is a panel of a one-layer structure having a layer made of sapphire which is disposed on the surface of the electronic apparatus 1. Here, sapphire refers to a single crystal containing alumina ($Al_2O_3$) as a main component, and a single crystal whose purity of $Al_2O_3$ is approximately greater than or equal to 90% in the present specification. The purity of $Al_2O_3$ is preferably greater than or equal to 99% which provides a resistance to damage of the cover panel and a reduction of cracks or chipping.

In an example embodiment, the cover panel 2 is a panel of a one-layer structure having a layer made of sapphire which is disposed on the surface of the electronic apparatus 1. However, the cover panel 2 may be a composite panel (laminated panel) of a multilayer structure having such a layer. For example, the cover panel 2 may be a composite panel of a two-layered structure configured of a layer (sapphire panel) made of sapphire which is disposed on the surface of the electronic apparatus 1 and a layer (glass panel) made of glass which is attached to the layer. In addition, the cover panel 2 may be a composite panel of a three-layered structure configured of a layer (sapphire panel) made of sapphire which is disposed on the surface of the electronic apparatus 1, a layer (glass panel) made of glass which is attached to the layer made of sapphire, and a layer (sapphire panel) made of sapphire which is attached to the layer made of glass. Further, the cover panel 2 may include a layer made of crystalline materials other than sapphire such as diamond, zirconia, titania, crystal, lithium tantalate, and aluminum oxynitride.

The cover panel 2 includes a transparent and/or light transmissive display portion 2a (also referred to as a display window) transmitting the display of the display panel 120. The display portion 2a has, for example, a rectangular shape in a plan view. The visible light output from the display panel 120 passes through the display portion 2a and is emitted to the outside of the electronic apparatus 1. A user visually recognizes information displayed on the display panel 120 through the display portion 2a from the outside of the electronic apparatus 1.

A portion of a peripheral end 2b that surrounds the display portion 2a in the cover panel 2 is opaque and/or not transparent because of, for example, a film or the like that is attached thereto. Accordingly, the portion of the peripheral end 2b is a non-display portion that does not transmit the display of the display panel 120.

The case 3 has an approximately square shape with one surface that is partially opened. The case 3 of the electronic apparatus 1 includes a peripheral end of a front surface, a side surface, and a rear surface. The case 3 is formed of, for example, at least one of a resin and a metal. The resin forming the case 3 may be, for example, a polycarbonate resin, an acrylonitrile butadiene styrene (ABS) resin, or a nylon-based resin. A metal forming the case 3 may be, for example, aluminum. The case 3 may be configured of only one material or a combination of materials.

As illustrated in FIG. 4, a touch panel 130 is attached to the inner surface 21 of the cover panel 2. The display panel 120 which is a display unit is attached to the surface on the opposite side to the inner surface 21 of the touch panel 130. That is, the display panel 120 is installed on the inner surface 21 of the cover panel 2 with the touch panel 130 therebetween. A portion of the cover panel 2 facing the display panel 120 is the display portion 2a. The user can provide various instructions with respect to the electronic apparatus 1 by operating the display portion 2a of the cover panel 2 using a finger or the like.

A printed board 260 on which various components such as a CPU 101, a DSP 102, and the like described below are mounted is disposed in the inside of the case 3. The printed board 260 is disposed between a rear surface 10 side of the electronic apparatus 1 and the display panel 120.

An operation unit 200, described below, and illustrated in FIG. 6, includes an operation button 201 that is disposed in the inside of the case 3. The surface of the operation button 201 is exposed from the lower end of the outer surface 20 of the cover panel 2. A hole (for example, a through-hole) 22 that penetrates the cover panel 2 in the thickness direction thereof is configured at the lower end of the cover panel 2. The hole 22 is configured at the central portion in the lateral direction in the lower end of the cover panel 2. The operation button 201 is exposed from the hole 22. Although one operation button 201 is shown disposed with respect to the operation unit 200, a plurality of the operation buttons 201 exposed from the cover panel 2 may be provided. The operation button 201 may be, for example, glass or resin. Other materials that may be used for the operation button 201 include crystalline materials such as sapphire, diamond, zirconia, titania, crystal, lithium tantalate, and aluminum oxynitride. Further, the operation button 201 may not be provided. In this case, the hole 22 is not necessary in the cover panel 2 and no hole is formed on the cover panel 2.

Figure 6:
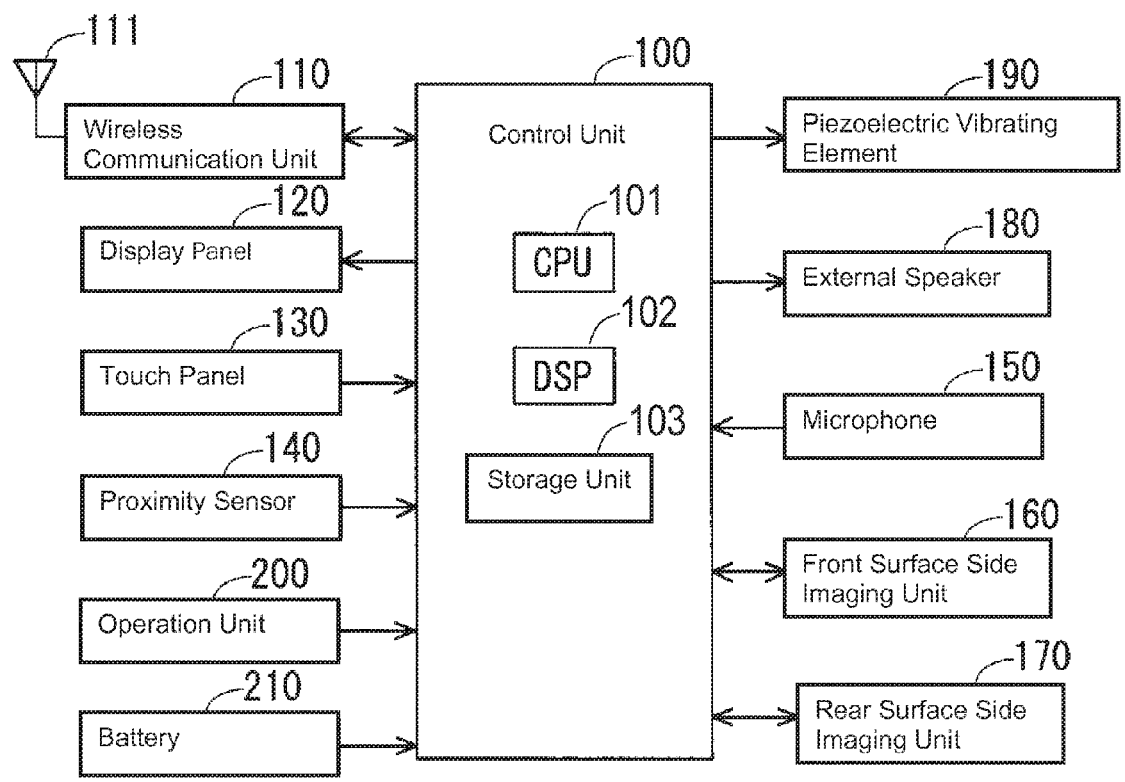
FIG. 6 is a view illustrating an example of an electrical configuration of an electronic apparatus.

As illustrated in FIG. 4 and FIG. 6, a proximity sensor 140, a front imaging unit 160, a rear imaging unit 170, and a piezoelectric vibrating element 190 are disposed in the inside of the case 3. As illustrated in FIG. 4, the piezoelectric vibrating element 190 is attached to the inner surface 21 of the cover panel 2 by an attaching member 250. For example, a double-sided tape or an adhesive may be adopted as an attaching member 250.

A first transparent portion 40 for visual recognition of the proximity sensor 140 is disposed in the upper end of the cover panel 2. A second transparent portion 50 for visual recognition of an imaging lens is included in the front imaging unit 160, and is disposed on the upper end of the cover panel 2.

A illustrated in FIG. 3, a third transparent portion 60 for visual recognition of the imaging lens is included in the rear imaging unit 170 is disposed on the rear surface 10 of the electronic apparatus 1. Speaker holes 70 are formed on the rear surface 10 of the electronic apparatus 1.

The cover panel 2 is attached to the case 3 by an attaching member. Specifically, the inner surface 21 of the cover panel 2 is attached to the case 3 through the attaching member. In this manner, the inner surface 21 of the cover panel 2 is supported by the case 3. A battery 210 is in the inside of the case 3.

In FIG. 5, an area attached to the case 3 by the attaching member on the inner surface 21 of the cover panel 2 is indicated by oblique lines. As illustrated in FIG. 1 and FIG. 5, the case 3 is attached to the peripheral edge on the inner surface 21 of the cover panel 2 such that the case 3 surrounds the entire circumference of the display portion 2a of the cover panel 2. That is, the case 3 supports the peripheral edge on the inner surface 21 of the cover panel 2 such that the case 3 surrounds the circumference of the display portion 2a of the cover panel 2.

In the upper end on the inner surface 21 of the cover panel 2, a portion on the upper side (outer side) of the first transparent portion 40 and second transparent portion 50 i is attached to the case 3. In the lower end on the inner surface 21 of the cover panel 2, a large part of the area on the lower side of the display portion 2a is attached to the case 3.

In an example embodiment, as illustrated in FIG. 4, a gap reduction member 270 is disposed in the inside of the electronic apparatus 1. The gap reduction member 270 is described below.

<Electrical Configuration of Electronic Apparatus>

FIG. 6 is a block diagram mainly illustrating an electrical configuration of the electronic apparatus 1. As illustrated in FIG. 6, the electronic apparatus 1 includes the control unit 100, a wireless communication unit 110, the display panel 120, the touch panel 130, the proximity sensor 140, and a microphone 150. Further, the electronic apparatus 1 includes a front imaging unit 160, a rear imaging unit 170, an external speaker 180, a piezoelectric vibrating element 190, an operation unit 200, and a battery 210. These elements are accommodated in the case 3.

The control unit 100 includes a Central Processing Unit (CPU) 101, a Digital Signal Processor (DSP) 102, and a storage unit 103. The control unit 100 manages the overall operation of the electronic apparatus 1 by controlling other elements of the electronic apparatus 1.

The storage unit 103 is a recording medium which is non-transitory and is readable by the control unit 100 (CPU) 101 and Digital Signal Processor (DSP) 102 such as a Read Only Memory (ROM) and a Random Access Memory (RAM). A main program, a plurality of application programs, and the like, which are control programs for controlling the electronic apparatus 1, specifically, for controlling respective elements such as the wireless communication unit 110, the display panel 120, and the like, are stored in the storage unit 103. Various functions of the control unit 100 can be realized by the CPU 101 and the DSP 102 executing various programs in the storage unit 103.

Further, in addition to the ROM and the RAM, the storage unit 103 may include a non-transitory recording medium, which is readable by a computer. The storage unit 103 may include a compact hard disk drive and a Solid State Drive (SSD).

The wireless communication unit 110 includes an antenna 111. In the wireless communication unit 110, the antenna 111 receives a signal from a mobile phone different from the electronic apparatus 1, or from a communication device such as a web server connected to the Internet via a base station. The wireless communication unit 110 performs an amplification process and down conversion on the received signal and outputs the signal to the control unit 100. The control unit 100 performs demodulation processing or the like on the received signal, and acquires a sound signal (sound information) indicating a voice or music included in the received signal.

Further, the wireless communication unit 110 performs up-converting and the amplification process on a transmission signal including a sound signal or the like generated in the control unit 100, and transmits the transmission signal after the process from the antenna 111 in a wireless manner. The transmission signal from the antenna 111 is received in a communication device connected to the Internet or a mobile phone different from the electronic apparatus 1 via the base station.

The display panel 120 is, for example, a liquid crystal display panel or an organic electro luminescent (EL) panel. The display panel 120 displays various pieces of information such as characters, symbols, and figures by control of the control unit 100. The information displayed in the display panel 120 can be visually recognized by the user of the electronic apparatus 1 through the display portion 2a of the cover panel 2.

The touch panel 130 is, for example, a projection type electrostatic capacitance touch panel in a form of a sheet. The touch panel 130 detects contact of an object with respect to the display portion 2a of the cover panel 2, and outputs a detection signal according to the detected contact. The touch panel 130 is attached to the inner surface 21 of the cover panel 2. The control unit 100 specifies the contents of an operation performed on the display portion 2a of the cover panel 2 based on the detection signal output from the touch panel 130, and performs an operation according to the specified contents.

The proximity sensor 140 is, for example, an infrared type proximity sensor. The proximity sensor 140 outputs a detection signal when an object approaches the proximity sensor 140 within a predetermined distance. The detection signal is input to the control unit 100. When the control unit 100 receives the detection signal from the proximity sensor 140, for example, the control unit 100 stops a function of detecting an operation of the touch panel 130.

The front imaging unit 160 includes an imaging lens, an imaging element, and the like. The front imaging unit 160 images a still image and a moving image based on the control by the control unit 100. The imaging lens of the front imaging unit 160 can be visually recognized from the second transparent portion 50 on the front surface of the electronic apparatus 1. Therefore, the front imaging unit 160 can image an object in front of the surface side (cover panel 2 side) of the electronic apparatus 1.

The rear surface imaging unit 170 includes an imaging lens, an imaging element, and the like. The rear imaging unit 170 images a still image and a moving image based on the control by the control unit 100. The imaging lens of the rear imaging unit 170 can be recognized from the third transparent portion 60 on the rear surface of the electronic apparatus 1. Therefore, the rear surface 10 side imaging unit 170 can image an object in front of the rear surface 10 side of the electronic apparatus 1.

The microphone 150 outputs a sound from the outside of the electronic apparatus 1 to the control unit 100 by converting the sound into an electric sound signal. The sound from the outside of the electronic apparatus 1 is received by the microphone 150 through microphone holes (not illustrated) configured on the surface of the electronic apparatus 1.

The external speaker 180 is, for example, a dynamic speaker. The external speaker 180 converts the electric sound signal from the control unit 100 into a sound and then outputs the sound. The sound output from the external speaker 180 is output from the speaker holes 70 configured on the rear surface 10 of the electronic apparatus 1. The volume of the sound output from the speaker holes 70 is set to a degree such that the sound can be heard at a location separated from the electronic apparatus 1.

As illustrated in FIG. 4 and FIG. 6, the piezoelectric vibrating element 190 is attached to the inner surface 21 of the cover panel 2 disposed on the front surface of the electronic apparatus 1 by an attaching member 250 as described above. The piezoelectric vibrating element 190 is vibrated by a driving voltage applied from the control unit 100. The control unit 100 generates a driving voltage based on a sound signal and applies the driving voltage to the piezoelectric vibrating element 190. The cover panel 2 is vibrated by the piezoelectric vibrating element 190 which vibrates based on the driving voltage form the control unit 100. As a result, a reception sound is transmitted to the user from the cover panel 2. The volume of the reception sound is set to a degree such that the user can appropriately hear the sound when the cover panel 2 is set close against an ear of the user.

The operation unit 200 includes an operation button 201 and a switch and detects an operation with respect to the operation button 201. The switch turns on when the operation button 201 is pressed (operated). The operation unit 200 outputs an ON signal, indicating that the operation button 201 is operated, to the control unit 100 when the switch is turned on. In contrast, the operation unit 200 outputs an OFF signal, indicating that the operation button 201 is not operated, to the control unit 100 when the operation button 201 has not operated for a predetermined time and the switch is turned OFF. The control unit 100 determines whether the operation button 201 is operated or not based on the ON signal and the OFF signal input from the operation unit 200, and performs an operation according to the determination result.

The battery 210 outputs a power source for use by the electronic apparatus 1. The power source output from the battery 210 is supplied to respective electronic components contained in the control unit 100 or the wireless communication unit 110 included in the electronic apparatus 1.

<Details of Piezoelectric Vibrating Element>

Figure 7:
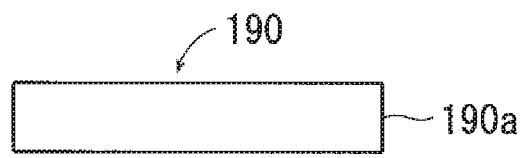
FIG. 7 is a top view illustrating an example of a configuration of a piezoelectric vibrating element.
Figure 8:
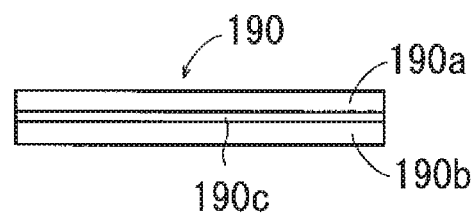
FIG. 8 is a side surface view illustrating an example of a configuration of a piezoelectric vibrating element.

FIGS. 7 and 8 illustrate a top view and a side view, respectively, of a structure of the piezoelectric vibrating element 190. As illustrated in FIGS. 7 and 8, the piezoelectric vibrating element 190 has a long shape in one direction. Specifically, the piezoelectric vibrating element 190 has a long and narrow rectangular plate shape in a plan view. The piezoelectric vibrating element 190 has, for example, a bimorph structure. The piezoelectric vibrating element 190 includes a first piezoelectric ceramic plate 190a and a second piezoelectric ceramic plate 190b which are bonded to each other through a shim material 190c.

In the piezoelectric vibrating element 190, when a positive voltage is applied to the first piezoelectric ceramic plate 190a and a negative voltage is applied to the second piezoelectric ceramic plate 190b, the first piezoelectric ceramic plate 190a extends along the longitudinal direction and the second piezoelectric ceramic plate 190b contracts along the longitudinal direction. Accordingly, as illustrated in FIG. 9, the piezoelectric vibrating element 190 is bent into a convex shape with the first piezoelectric ceramic plate 190a being outside.

In contrast, in the piezoelectric vibrating element 190, when a negative voltage is applied to the first piezoelectric ceramic plate 190a and a positive voltage is applied to the second piezoelectric ceramic plate 190b, the first piezoelectric ceramic plate 190a contracts along the longitudinal direction and the second piezoelectric ceramic plate 190b extends along the longitudinal direction. Accordingly, as illustrated in FIG. 10, the piezoelectric vibrating element 190 is bent into a convex shape with the second piezoelectric ceramic plate 190b being outside.

Figure 9:
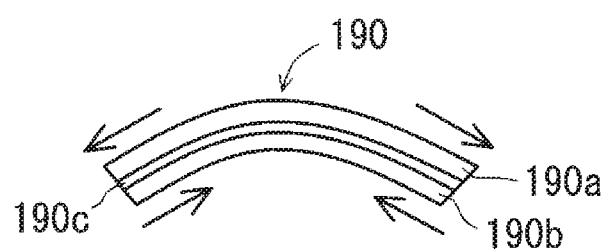
FIG. 9 is a view illustrating an example of a state of a piezoelectric vibrating element.
Figure 10:
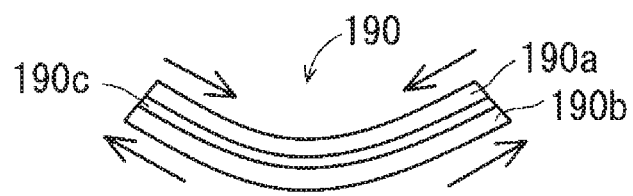
FIG. 10 is a view illustrating an example of the state of a piezoelectric vibrating element.

The piezoelectric vibrating element 190 vibrates while being bent along the longitudinal direction by alternatively taking the state of FIG. 9 and FIG. 10. The control unit 100 allows the piezoelectric vibrating element 190 to vibrate while being bent along the longitudinal direction by applying an alternating current (AC) voltage in which the positive voltage and the negative voltage alternatively appear at an area between the first piezoelectric ceramic plate 190a and the second piezoelectric ceramic plate 190b.

Only one structure made of the first piezoelectric ceramic plate 190a and the second piezoelectric ceramic plate 190b, which are bonded to each other by interposing the shim material 190c therebetween, is provided in the piezoelectric vibrating element 190 illustrated in FIGS. 7 to 10. However, a plurality of the structures may be laminated to each other.

The piezoelectric vibrating element 190 having such a structure is disposed on the peripheral end of the inner surface 21 of the cover panel 2, as illustrated in FIG. 5. Specifically, the piezoelectric vibrating element 190 is disposed in a central portion in a short-length direction DR2 in the upper end of the inner surface 21 of the cover panel 2. The longitudinal direction of the piezoelectric vibrating element 190 is disposed along the short-length direction DR2 of the cover panel 2. In this manner, the piezoelectric vibrating element 190 vibrates while being bent along the short-length direction DR2 of the cover panel 2. Further, the center of the longitudinal direction of the piezoelectric vibrating element 190 corresponds to the center of the short-length direction DR2 in the upper end of the inner surface 21 of the cover panel 2.

As illustrated in FIGS. 9 and 10, the center of the longitudinal direction of the piezoelectric vibrating element 190 has the largest displacement amount when the piezoelectric vibrating element 190 is vibrating. Accordingly, an area in the center of the short-length direction DR2 in the upper end of the inner surface 21 of the cover panel 2, that corresponds to the position of the piezoelectric vibrating element, has the largest displacement amount of bending and vibrating.

As illustrated in FIG. 5, a partial area 220 in the upper end of the cover panel 2, on which the front surface side of the case 3 and the display panel 120 are not mounted, has a long shape along the short-length direction DR2 of the cover panel 2. Therefore, the partial area 220 is easily bent along the short-length direction DR2 compared to the longitudinal direction DR1 because of the shape thereof. Since the longitudinal direction (direction of the piezoelectric vibrating element vibrating while being bent) of the piezoelectric vibrating element 190 is disposed in the partial area 220 along the longitudinal direction of the partial area 220, the partial area 220 easily vibrates. Therefore, the reception sound becomes easily transmitted to the user from the cover panel 2.

As illustrated in FIG. 7 to FIG. 10, only one structure made of the first piezoelectric ceramic plate 190a and the second piezoelectric ceramic plate 190b, which are bonded to each other by interposing the shim material 190c therebetween, is provided in the piezoelectric vibrating element 190. However, a plurality of the structures may be laminated to each other. For example, twenty-eight or more layers that are laminated provide an increased level of vibration that can be transmitted to the cover panel 2. Accordingly forty-four or more layers that are laminated provide an increased sufficiency in the vibration that can be transmitted to the cover panel 2.

Further, the piezoelectric vibrating element 190 may be made of organic piezoelectric materials such as polyvinylidene fluoride and polylactic acid in addition to the piezoelectric ceramic materials. For example, the piezoelectric vibrating element 190 is configured such that films made of polylactic acid are used as a first piezoelectric plate and a second piezoelectric plate and they are laminated to each other. In addition, in regard to an electrode, a transparent electrode such as Indium-Tin-Oxide (that is, indium tin oxide, ITO) is possible to be used.

<Regarding Generation of Reception Sound>

In the electronic apparatus 1, an air conduction sound and a conduction sound are transmitted to the user by the piezoelectric vibrating element 190 through the cover panel 2 which is vibrated by the piezoelectric vibrating element 190. That is, the vibration of the piezoelectric vibrating element 190 is transmitted to the cover panel 2 so that the air conduction sound and the conduction sound are transmitted to the user from the cover panel 2.

Here, the term "air conduction sound" means a sound recognized in a human brain by the vibration of an eardrum due to a sound wave (air vibration) which enters an external auditory meatus hole (a so-called "ear hole"). On the other hand, the term "conduction sound" is a sound recognized in a human brain by the vibration of the eardrum due to the vibration of an auricle transmitted to the eardrum. Hereinafter, the air conduction sound and the conduction sound will be described in detail.

Figure 11:
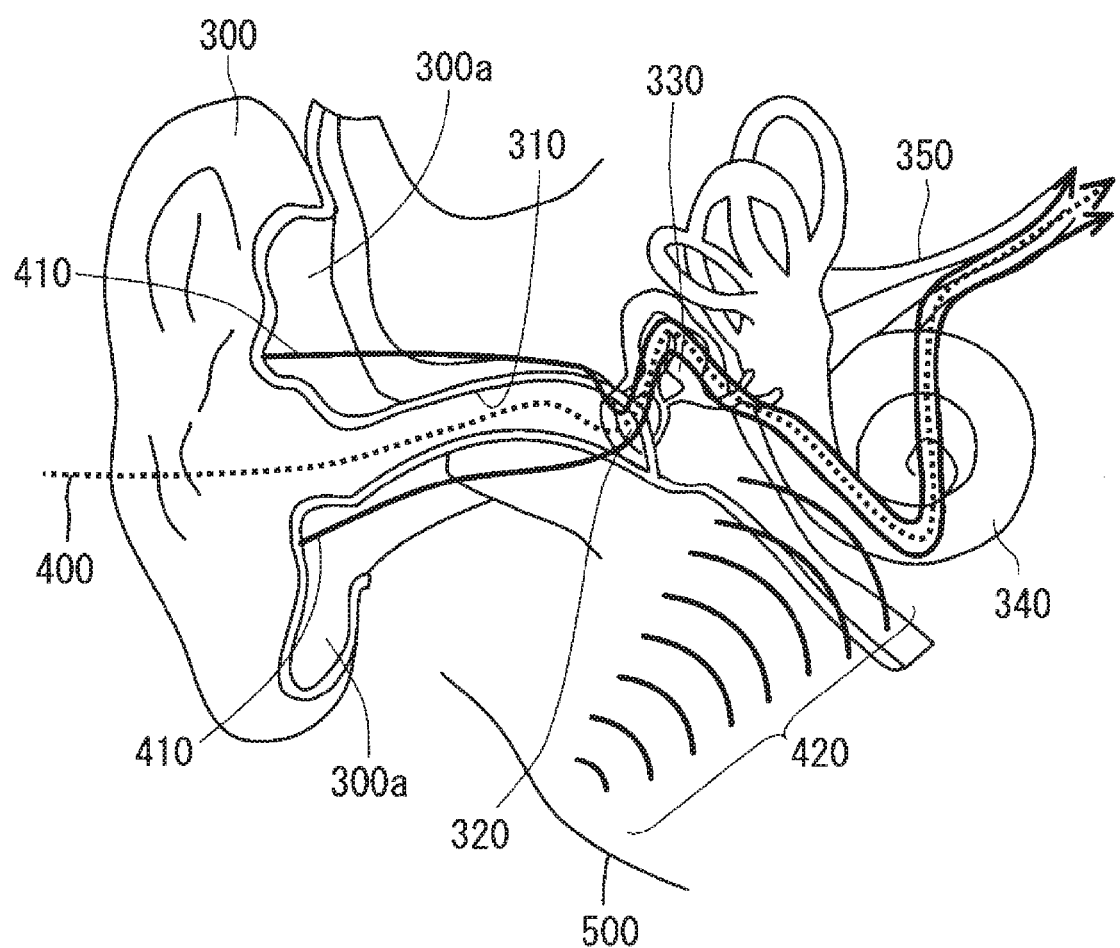
FIG. 11 is a view for describing an air conduction sound and a conduction sound.

FIG. 11 is a view for describing the air conduction sound and the conduction sound. FIG. 11 illustrates a structure of an ear of the user of the electronic apparatus 1. In FIG. 11, a dotted line 400 indicates a conduction path of a sound signal (sound information) of the air conduction sound. A solid line 410 indicates the conduction path of the sound signal of the conduction sound.

When the piezoelectric vibrating element 190 mounted on the cover panel 2 vibrates based on the electric sound signal indicating the reception sound, the cover panel 2 vibrates, and a sound wave is output from the cover panel 2. When the user moves the cover panel 2 of the electronic apparatus 1 close to an auricle 300 of the user by holding the electronic apparatus 1 in a hand, or the cover panel 2 of the electronic apparatus 1 is set to (brought into contact with) the auricle 300 of the user, the sound wave output from the cover panel 2 enters an external auditory meatus hole 310. The sound wave from the cover panel 2 enters in the external auditory meatus hole 310 and the eardrum 320, and the eardrum 320 vibrates. The vibration of the eardrum 320 is transmitted to an auditory ossicle 330 and the auditory ossicle 330 vibrates. In addition, the vibration of the auditory ossicle 330 is transmitted to a cochlea 340 and is converted into an electrical signal in the cochlea 340. The electrical signal is transmitted to the brain by passing through an acoustic nerve 350 and the reception sound is recognized in the brain. In this manner, the air conduction sound is transmitted from the cover panel 2 to the user.

Further, when the user puts the cover panel 2 of the electronic apparatus 1 to the auricle 300 of the user by holding the electronic apparatus 1 in a hand, the auricle 300 is vibrated by the cover panel 2, which cover panel 2 is vibrated by the piezoelectric vibrating element 190. The vibration of the auricle 300 is transmitted to the eardrum 320, and thus the eardrum 320 vibrates. The vibration of the eardrum 320 is transmitted to the auditory ossicle 330, and thus the auditory ossicle 330 vibrates. The vibration of the auditory ossicle 330 is transmitted to the cochlea 340 and is converted into an electrical signal in the cochlea 340. The electrical signal is transmitted to the brain by passing through the acoustic nerve 350 and the reception sound is recognized in the brain. In this manner, the conduction sound is transmitted from the cover panel 2 to the user. FIG. 11 illustrates an auricular cartilage 300a in the inside of the auricle 300.

Bone conduction sound is a sound recognized in a human brain by the vibration of the skull and direct stimulation of the inner ear such as the cochlea caused by the vibration of the skull. In FIG. 11, in a case of vibrating the jawbone 500, the transmission path of the sound signal while the bone conduction sound is recognized in the brain is indicated with a plurality of arcs 420.

As described above, the air conduction sound and the conduction sound can be transmitted from the cover panel 2 to the user of the electronic apparatus 1 due to the vibration of the cover panel 2 through the vibration of the piezoelectric vibrating element 190. The user can hear the air conduction sound from the cover panel 2 by moving the cover panel 2 close to an ear (auricle). Further, the user can hear the air conduction sound and the conduction sound from the cover panel 2 by bringing the cover panel 2 into contact with an ear (auricle).

Since the user can hear a sound when the user puts the cover panel 2 to an ear, communication using the electronic apparatus 1 can be performed without much concerning regarding the position of the electronic apparatus 1 with respect to the ear.

In addition, since the user can hear the conduction sound due to the vibration of the auricle, it easy for the user to hear the sound even when there is a large amount of ambient noise. Accordingly, the user can appropriately perform communication even when there is a large amount of the ambient noise.

In addition, even in a state in which earplugs or earphones are fixed to the ears of the user, the reception sound from the electronic apparatus 1 can be recognized by setting the cover panel 2 to the auricle. Further, even in the state in which headphones are fixed to the ears of the user, the reception sound from the electronic apparatus 1 can be recognized by putting the cover panel 2 to the headphones.

The sound from the cover panel 2 becomes easy to hear when the user moves the upper end of the cover panel 2 (particularly, the central portion of the upper end in the short-length direction DR2 which corresponds to the placement of the piezoelectric vibrating element 190) close to an ear, or puts the upper end thereof to an ear.

In another example, a general dynamic receiver may be provided instead of or in addition to the piezoelectric vibrating element 190.

<Gap Reduction Member>

In FIG. 4, the printed board 260 includes a board 262 and a plurality of components 264. The board 262 has a plate shape, and the board 262 is disposed in an area (that is, the inner surface 21 side area of the cover panel 2) facing the cover panel 2. More specifically, the board 262 is disposed so as to face the display panel 120, that is, the board 262 faces the cover panel 2 through the display panel 120 and the touch panel 130. The plurality of components 264 includes various electronic components (for example, a resistor, a switch element, or semiconductor module exhibiting a specific function such as the control unit 100), components for protecting, shielding, or fixing these electronic components, or one or more connectors which electrically connect an external memory or the like to the board 262. These plurality of components 264 are disposed on the board 262. In FIG. 4, the plurality of components 264 are disposed on the display panel 120 side of the board 262. Several components 264 have heights (heights in the direction perpendicular to the surface of the board 262) different from one another.

The gap reduction member 270 is a different body from the case 3, and is disposed so as to face the printed board 260 from the plurality of components 264 side. That is, the gap reduction member 270 faces the plurality of components 264 through a space. The gap reduction member 270 has an approximate plate shape and steps are formed on a facing surface (surface on the printed board 260 side) 272 which faces the components 264. The steps are formed according to the heights of the plurality of components 264. In FIG. 4, the facing surface 272 of the gap reduction member 270 includes a first surface 272a facing a relatively low component 264 (component having the relatively low height) and a second surface 272b facing a relatively high component 264 (component having the relatively high height). The first surface 272a is positioned closer to the printed board 260 side than the second surface 272b. The first surface 272a is connected with the second surface 272b by forming steps.

In FIG. 4, the first surface 272a is positioned on the board 262 side more than the top surface of the relatively high component 264. Accordingly, the gap between the relatively low component 264 and the gap reduction member 270 (more specifically, a facing surface 272) is further decreased.

The material of the gap reduction member 270 is not limited as long as the material is a solid, and, for example, a resin or a metal (for example, aluminum) can be adopted. The gap reduction member 270 is fixed to the electronic apparatus 1 (for example, to the case 3).

It is possible to reduce breakage of the cover panel 2 as described below according to the gap reduction member 270. An example of pressing the cover panel 2 to the rear surface 10 side is considered. Here, the cover panel 2 is pressed at a position in which the gap reduction member 270 is disposed in a plan view. In this example, the cover panel 2, the touch panel 130, and the display panel 120 are approximately integrally displaced to the rear surface 10 side in the pressed portion. In addition, when the displacement amount is increased, the display panel 120 presses the gap reduction member 270. Since the gap reduction member 270 presses back the display panel 120 by the action or the reaction thereof, displacement of the cover panel 2 can be reduced. Accordingly, the displacement of the cover panel 2 can be reduced when compared to the structure in which the gap reduction member 270 is not provided. Further, the breakage of the cover panel 2 can be reduced.

In addition, when a pressing force with respect to the cover panel 2 is large, the gap reduction member 270 is displaced towards the printed board 260 side and is brought into contact with the printed board 260. In this manner, the gap reduction member 270 presses the printed board 260. The printed board 260 presses back the gap reduction member 270 to the cover panel 2 side by the action or the reaction thereof.

Further, the facing surface 272 of the gap reduction member 270 has steps according to the heights of the components 264. Accordingly, for example, the gap between the gap reduction member 270 and the relatively low component 264 can be reduced when compared to another printed board (not shown) where the facing surface 272 of the gap reduction member 270 has an approximately planar shape without having steps. When the cover panel 2 is pressed in the position where the relatively low component 264 is disposed, the gap reduction member 270 is brought into contact with the printed board 260 with smaller displacement. Therefore, the displacement of the cover panel 2 can be effectively reduced when compared to another printed board (not shown) where the surface of the gap reduction member 270 has an approximately planar shape, and the breakage of the cover panel 2 can be effectively reduced.

Further, the steps in accordance with the heights of the components 264 herein are not necessarily steps in accordance with each height of every component 264. That is, in an example printed board, steps in accordance with a group of relatively high heights and a group of relatively low heights among the components 264 may be formed. In another example printed board, steps in accordance with each height of every component 264 may be formed.

In FIG. 4, the surface 274 of the gap reduction member 270 on the opposite side of the facing surface 272 has an approximately planar shape along the display panel 120. That is, the surface 274 has a shape corresponding to the surface of the member (display panel 120) which faces and is adjacent to the surface 274. In this manner, the thickness of the gap reduction member 270 (thickness in a direction perpendicular to the board 262) varies so that the gap reduction member 270 becomes more difficult to be displaced in the thickness direction. Therefore, the displacement of the cover panel 2 can be further reduced and the breakage of the cover panel 2 can be further reduced.

Figure 12:
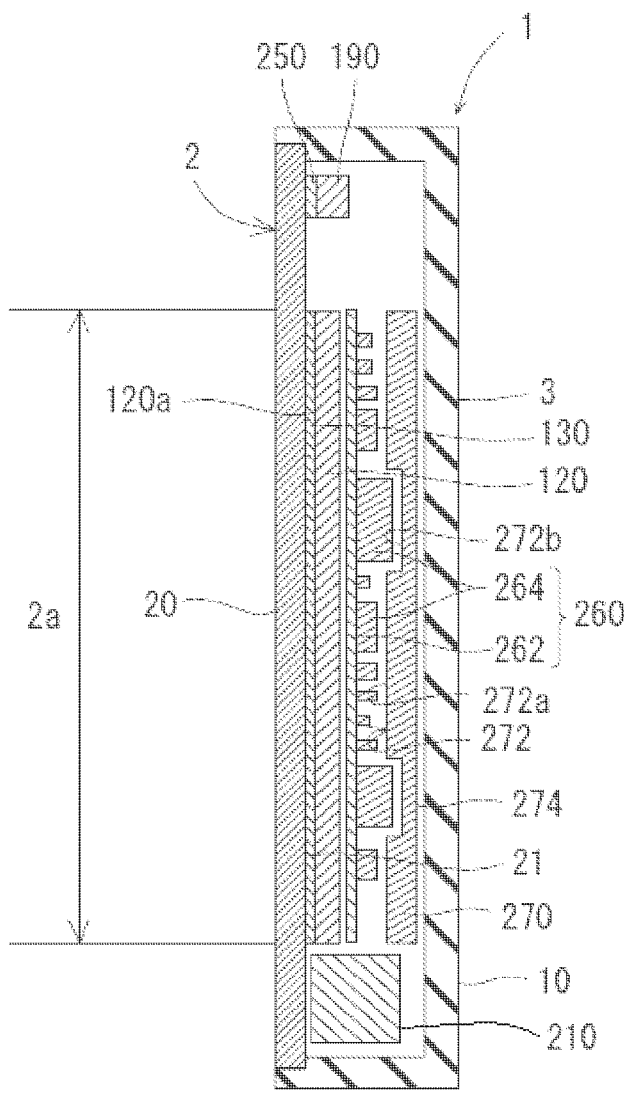
FIG. 12 is a view illustrating an example of a cross-sectional structure of an electronic apparatus.

In addition, in the above-described embodiment, the components 264 are disposed on the surface on the display panel 120 side of the board 262, but may be disposed on the surface on the opposite side to the display panel 120 as illustrated in FIG. 12. Even in this example, the gap reduction member 270 is disposed so as to face the printed board 260 from the components 264 side. That is, the gap reduction member 270 is disposed between the printed board 260 and the case 3 (more specifically, a portion forming the rear surface 10), and directly faces the components 264.

In this example, when a portion of the rear surface 10 side of the case 3 is pressed, the displacement of the case 3 can be reduced by the mechanism which is the same as that in FIG. 4. Consequently, even if the portion of the rear surface 10 side of the case 3 is formed of a material having high hardness (for example, sapphire, diamond, zirconia, titania, crystal, lithium tantalate, or aluminum oxynitride), the breakage of the case 3 can be reduced.

Alternatively, the displacement of the cover panel 2 can be reduced as well. When the cover panel 2 is pressed, the display panel 120 is brought into contact with the printed board 260, and presses to the printed board 260. Since the printed board 260 presses back the display panel 120 by the mechanism or the reaction thereof, more displacement of the cover panel 2 is reduced. When a pressing force of the cover panel 2 is large and the printed board 260 is more displaced, the printed board 260 presses the gap reduction member 270 while being in contact with the gap reduction member 270. Since the gap reduction member 270 presses back the printed board 260 by the action or the reaction thereof, more displacement of the cover panel 2 is reduced.

In addition, in FIG. 12, the facing surface 272 of the gap reduction member 270 has steps in accordance with the heights of the components 264. Therefore, the printed board 260 is brought into contact with the gap reduction member 270 with less displacement even when the printed board 260 is displaced to the gap reduction member 270 side in the portion facing the relatively low component 264. Consequently, the printed board 260 and the gap reduction member 270 press back the cover panel 2 so that the displacement can be effectively reduced. In this manner, the breakage of the cover panel 2 can be effectively reduced.

In the above-described examples, the components 264 are disposed on one surface of the board 262, but the components 264 may be disposed on both surfaces. In this example (not shown), the above-described two gap reduction members 270 may be disposed adjacent first and second surfaces of the board 260. The printed board 260 is interposed by these two gap reduction members 270. Alternatively, only one gap reduction member 270 may be disposed on one of the two surfaces. A configuration in which both of the two gap reduction members 270 are disposed adjacent the first and second surfaces of the board can reduce the displacement of the cover panel 2. In a modified example (not shown), the gap reduction member 270 may extend beyond the printed board 260 to provide support for the sapphire panel in areas of the housing where gaps are formed between components.

Figure 13:
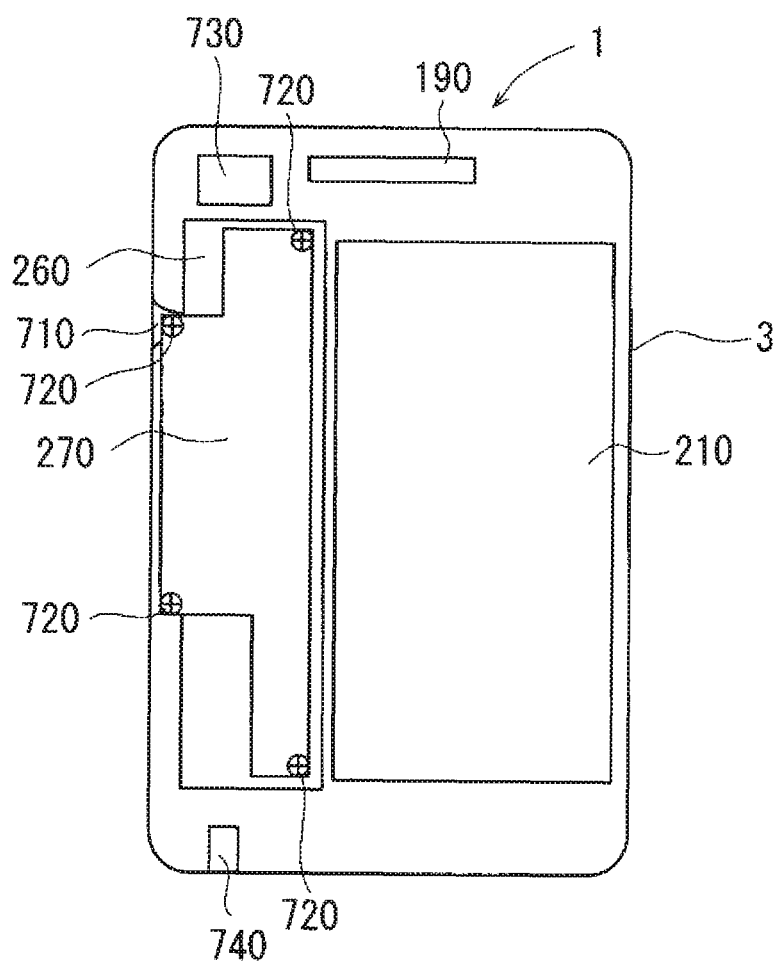
FIG. 13 is a plan view illustrating an example of an internal structure of an electronic apparatus.

FIG. 13 is a plan view schematically illustrating an example of the internal structure of an electronic apparatus 1, and is a view of the electronic apparatus 1 when seen from the rear surface 10 side. For example, the printed board 260 has a long shape along the longitudinal direction of the electronic apparatus 1, and the battery 210 has a long shape along the longitudinal direction of the electronic apparatus 1. The printed board 260 and the battery 210 are disposed so as to be adjacent to each other in the short-length direction. Further, a vibrator 730 that performs notification with respect to the user, and a headphone port 740 to which an external headphone is connected, are illustrated in FIG. 13. In addition, other members (for example, various devices described in FIG. 6) may be disposed, although the illustration omits these various devices for easy understanding.

In FIG. 13, the gap reduction member 270 is disposed on the rear surface 10 side. The gap reduction member 270 is fixed to the electronic apparatus 1 by, for example, a spring 720 or the like. In this manner, the strength of the entire electronic apparatus 1 can be improved.

Figure 14:
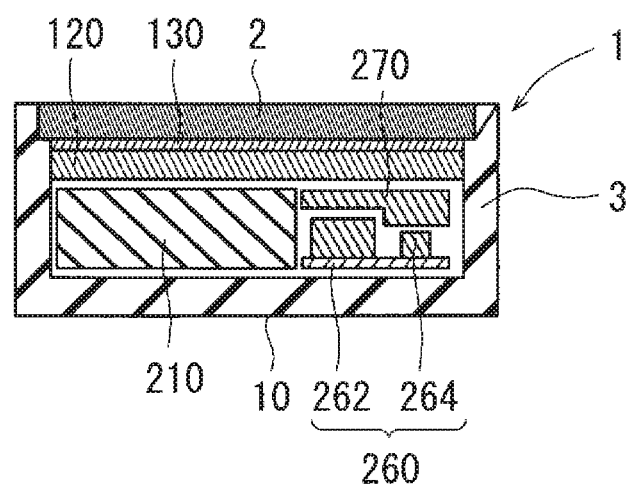
FIG. 14 is a cross-sectional view illustrating an example of an internal structure of an electronic apparatus.

FIG. 14 is a cross-sectional view illustrating an embodiment of the internal structure of the electronic apparatus 1. In FIG. 14, the gap reduction member 270 is disposed on the printed board 260 in the cover panel 2 side. In an example illustrated in FIG. 14, the battery 210 is adjacent to the printed board 260 in the direction parallel to the board 262, (and is disposed in an area facing the cover panel 2. Further, the battery 210 has height greater than that of the printed board 260. Accordingly, when the gap reduction member 270 is not disposed in the electronic apparatus 1, there is a difference between heights (steps) of the battery 210 and the printed board 260. However, as shown in FIG. 14, the gap reduction member 270 fills a space formed due to this height difference. Accordingly, the breakage of the cover panel 2 is effectively reduced.

In the example illustrated in FIG. 14, the surface of the battery 210 on the rear surface 10 side is positioned with the same height as that of the surface on the printed board 260 on the rear surface 10 side. Accordingly, the space between the cover panel 2 and the case 3 (portion on the rear surface 10 side) can be effectively reduced so that the breakage of the cover panel 2 can be effectively reduced.

Figure 15:
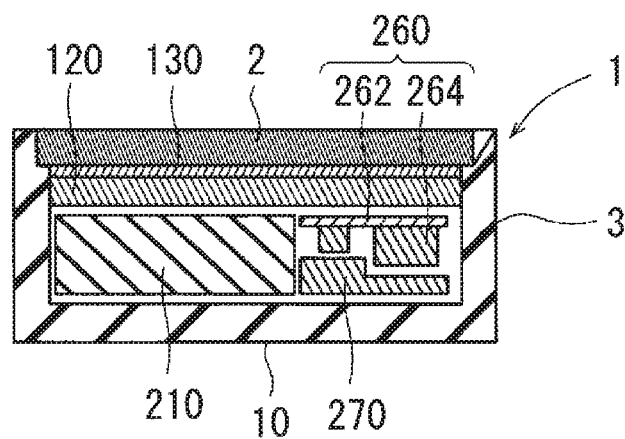
FIG. 15 is a cross-sectional view illustrating an example of an internal structure of an electronic apparatus.

Wif the printed board 260 is disposed on the cover panel 2 side more than the gap reduction member 270 as illustrated in FIG. 12, the rear surface 10 side surface of the battery 210 may be positioned with the same plane as the rear surface 10 side surface of the gap reduction member 270 as illustrated in FIG. 15.

The gap reduction member 270, in an example of the electronic apparatus, is formed of a conductor (for example, a metal, more specifically aluminum or the like), and the gap reduction member 270 is electrically connected to the ground. That is, a current generated in the gap reduction member 270 by the operation (for example, an operation of the control unit 100) of the printed board 260 can be sent to the ground. Accordingly, the operation of the printed board 260 can be stabilized. The electric connection between the gap reduction member 270 and the ground may be performed by an arbitrary technique. For example, as illustrated in FIG. 13, a member 710 is electrically connected to the conductive case 3, which is electrically connected to the ground. The gap reduction member 270 is in contact with and fixed to (co-fastened to) the member 710 in the spring 720. In addition, when a grounded board is provided in the electronic apparatus 1, the member 710 may be connected to the grounded board. Further, the member 710 may be connected to a ground pattern disposed in the printed board 260. Furthermore, the gap reduction member 270 may be directly connected to the conductive case 3 which is electrically connected to the ground, the grounded board, or the ground pattern of the printed board 260.

In addition, the gap reduction member 270 may be formed of a material (for example, a metal, more specifically aluminum or the like) having a heat transfer coefficient greater than that of the air. In this manner, the heat generated in the printed board 260 can be dissipated or dispersed. Therefore, increase in temperature of the printed board 260 (more specifically, an electronic component constituting, for example, the control unit 100) can be reduced. In one example, to enhance heat transfer, the surface 274 of the gap reduction member 270 may include, for example, fin-like structures or the like for providing increased heat sink properties, such that gaps between the fin-like structures are sufficiently small as to not reduce support of the panel 2.

Further, the area between the gap reduction member 270 and the components 264 may be coated with a high heat transfer resin having a high heat transfer coefficient. In this manner, the heat from the components 264 can be more effectively transferred to the gap reduction member 270. Therefore, increase in temperature of the printed board 260 (or components 264) can be effectively reduced.

The above-described examples are applied to a mobile phone. However, the example cover panels 2 and gap reduction members can be applied to an electronic apparatus other than a mobile phone such as a smart phone, a tablet terminal and a wearable type electronic apparatus mounting on an arm, digital books, digital cameras, electronic game machines, digital music players, personal digital assistance (PDA), personal handy phone system (PHS), lap top computers, portable TV's, Global Positioning Systems (GPS's) or navigation systems, machining tools, pedometers, health equipment such as weight scales, display monitors, wristwatch, and the like.

As described above, the electronic apparatus 1 has been described in detail, but the above description is merely an example in every aspect and the present invention is not limited thereto. Further, various modifications described above can be applied in combination as long as they do not contradict each other. In addition, it is understood that numerous modifications which are not exemplified above can be assumed without departing from the scope of the present invention. For example, as at least a part of the materials of the case 3, sapphire, diamond, zirconia, titania, crystal, lithium tantalate, or aluminum oxynitride may be adopted in the same manner as that of the cover panel 2.

The invention claimed is:

1. An electronic apparatus, comprising: a case; a panel that includes an outer surface facing outwards from the case, and an inner surface, the case and the panel forming a housing; a board that is disposed in the case; a plurality of components that are disposed on the board, the plurality of components having a plurality of heights; and a gap reduction member comprising a plurality of steps that are disposed so as to face the plurality of components, the plurality of steps having heights corresponding to the heights of the plurality of components, wherein the gap reduction member is disposed in a space between the panel and the board, the space formed in part due to a difference between the heights of the plurality of components in a direction perpendicular to the board.

2. The electronic apparatus according to claim 1, wherein the gap reduction member has a heat transfer coefficient greater than the heat transfer coefficient of the air.

3. The electronic apparatus according to claim 1, wherein the gap reduction member has electric conductivity and is electrically connected to a ground level.

4. The electronic apparatus according to claim 1, wherein the plurality of components are disposed on the surface of the board on a panel side that faces the panel, and the gap reduction member is disposed between the panel and the board.

5. The electronic apparatus according to claim 1, further comprising: a battery that is disposed to be adjacent to the board.

6. The electronic apparatus according to claim 1, wherein the plurality of components are disposed on a top surface of the board and on a rear surface of the board, wherein the gap reduction member comprises a first gap reduction member disposed between the panel and the board, and a second gap reduction member disposed between the board and a rear surface of the case.

7. The electronic apparatus according to claim 1, wherein a top surface of the gap reduction member comprises members to provide a heat sink for the board.

8. The electronic apparatus according to claim 1, wherein the gap reduction member extends beyond the board to provide support to the panel in areas of the housing that have gaps between components.

9. The electronic device of claim 1, wherein the gap reduction member extends beyond the circuit board to provide support to the panel in areas of the housing that have gaps between components.

10. An electronic device comprising: a housing; a panel on a top surface of the housing; a circuit board within the housing comprising a plurality of components with varying heights; a gap reduction member disposed between the panel and the circuit board and having a first surface to match the varying heights of the plurality of components, wherein the gap reduction member is disposed in a space between the panel and the circuit board, the space formed in part due to a difference between the heights of the plurality of components in a direction perpendicular to the circuit board.

11. The electronic device of claim 10, wherein the gap reduction member has a heat transfer coefficient greater than the heat transfer coefficient of the air.

12. The electronic device of claim 10, wherein the gap reduction member has electric conductivity and is electrically connected to a ground level.

13. The electronic device of claim 10, wherein the plurality of components of the circuit board are on a panel side that faces the panel, and the gap reduction member is disposed between the panel and the circuit board.

14. The electronic device of claim 10, further comprising: a battery that is adjacent to the circuit board.

15. The electronic device of claim 10, wherein the plurality of components are disposed on a top surface of the circuit board and on a rear surface of the circuit board, wherein the gap reduction member comprises a first gap reduction member disposed between the panel and the circuit board, and a second gap reduction member disposed between the circuit board and a rear surface of the housing.

16. The electronic device of claim 10, wherein a top surface of the gap reduction member comprises members to provide a heat sink for the circuit board.

* * * * *